United States Patent [19]

Penney

[11] Patent Number: 4,687,541

[45] Date of Patent: Aug. 18, 1987

[54] DUAL DEPOSITION SINGLE LEVEL LIFT-OFF PROCESS

[75] Inventor: James W. Penney, Thousand Oaks, Calif.

[73] Assignee: Rockwell International Corporation, El Segundo, Calif.

[21] Appl. No.: 909,804

[22] Filed: Sep. 22, 1986

[51] Int. Cl.[4] .................. B44C 1/22; C03C 15/00; C03C 25/06; B05D 5/12

[52] U.S. Cl. .................. 156/643; 156/644; 156/646; 156/651; 156/655; 156/659.1; 156/668; 204/192.3; 204/192.32; 427/89; 427/91; 430/315; 430/329

[58] Field of Search .............. 156/643, 644, 646, 650, 156/651–653, 655–659.1, 662, 668; 204/192.3, 192.32; 427/38, 39, 88–91, 96; 430/296, 313, 315, 329; 357/71; 29/580, 591

[56] References Cited

U.S. PATENT DOCUMENTS

| | | | |
|---|---|---|---|
| 3,822,467 | 7/1974 | Symersky | 29/591 X |
| 4,119,483 | 10/1978 | Hubsch et al. | 156/655 |
| 4,272,561 | 6/1981 | Rothman et al. | 156/650 X |
| 4,339,305 | 7/1982 | Jones | 156/650 |
| 4,451,554 | 5/1984 | Kishi et al. | 156/650 X |
| 4,614,564 | 9/1986 | Sheldon et al. | 156/653 X |
| 4,640,738 | 2/1987 | Fredericks et al. | 156/656 |

*Primary Examiner*—William A. Powell
*Attorney, Agent, or Firm*—H. Fredrick Hamann; Craig O. Malin

[57] ABSTRACT

A dual deposition liftoff process is provided for obtaining clearly defined, planar integrated circuit pattern definition. After developing a photoresist pattern on a substrate, a thin layer of sealing material which is compatible with the integrated circuit is deposited over the photoresist and the uncovered portions of the substrate. The sidewalls of the photoresist are then etched, thereby undercutting the sealing material and forming a lip which overhangs the sidewalls. A second layer of material is deposited on top of the thin layer to provide the required thickness for the integrated circuit. The overhanging lip protects the sidewalls from deposition and thus a good liftoff of the photoresist with its overlying layers is obtained.

13 Claims, 12 Drawing Figures

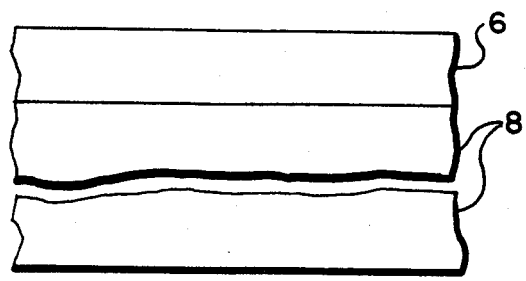
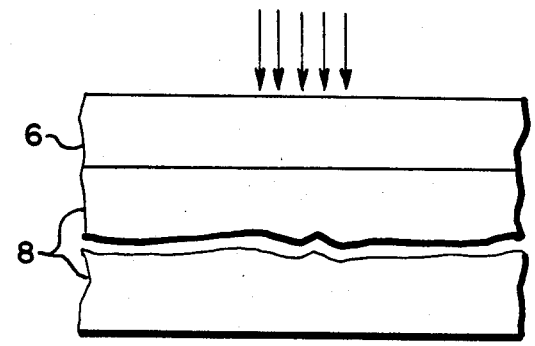
4.A.  4.B.
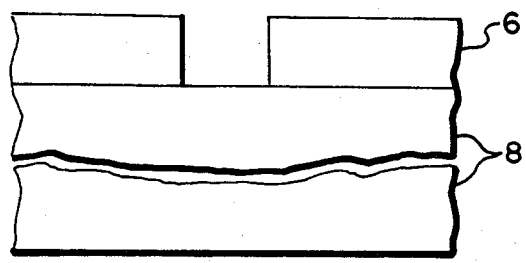
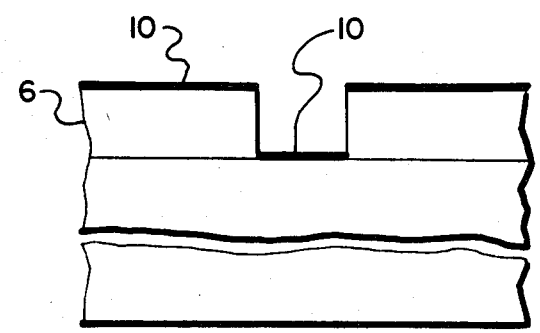
4.C.  4.D.
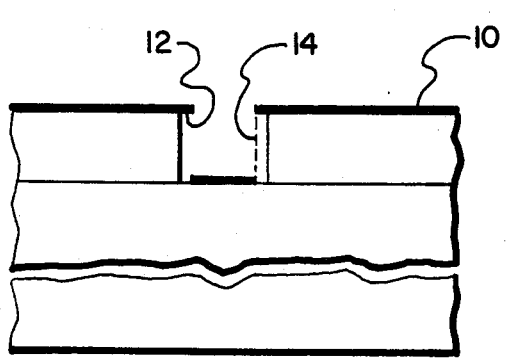
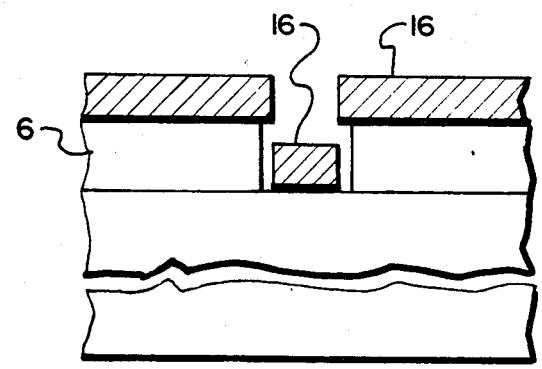
4.E.  4.F.
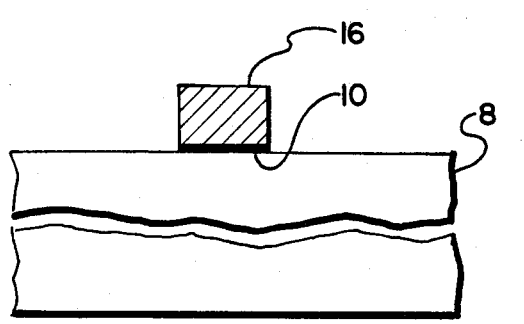
4.G.  Fig. 4.

DUAL DEPOSITION SINGLE LEVEL LIFT-OFF PROCESS

STATEMENT OF GOVERNMENT INTEREST

This invention was made with Government support under Contract No. F29601-84-C-0010 awarded by the Department of the Air Force.

BACKGROUND OF THE INVENTION

This invention relates to the field of solid state electronics, and particularly to a lithographic method to provide good lift-off when removing unwanted material during the processing of integrated circuits.

Current state of the art integrated circuit manufacturing requires processing methods capable of consistently producing microscopic pattern geometries. The dimensions of circuit features are routinely measured in microns ($10^{-6}$ meter). Processing methods are now required to produce fine pattern definition of metal or dielectric films in submicron dimensions.

The lift-off process is used in the fabrication of integrated circuits to define metal or dielectric film patterns on the substrate (wafer) surface. These patterns are used, for example, to connect circuit devices together with metal wiring. To complete a multilevel circuit, as many as four or five liftoff steps may be necessary. The liftoff process is particularly useful to fabricate integrated circuits on substrates such as gallium arsenide which utilize metallization and dielectric layers which are not easily removed by etching. The problems involved with the lift-off process influence and place practical constraints upon the design and manufacture of successful circuits on gallium arsenide, particularly as the circuit density moves into large scale and very large scale levels of integration (LSI and VLSI).

In general, the lift-off process utilizes three steps, as follows:

Step 1. A light sensitive photoresist emulsion is uniformly applied to the substrate surface. The photoresist is exposed by optical light or electron beam through a mask which defines a pattern on the substrate. The pattern is developed and the resist is baked to stabilize.

Step 2. Next the required metal or dielectric film is deposited on the patterned substrate. The deposition of material is done in a vacuum system by physical vapor evaporation or sputtering.

Step 3. Then liftoff of the unwanted film material around the pattern occurs by dissolving the photoresist in a suitable solvent such as acetone. The solvent can be sprayed on the substrate, or a solvent bath agitated by ultrasonic can be used to aid the liftoff process. The end result is the unwanted material rinses away leaving the patterned area intact on the wafer surface.

The problem with the liftoff process is in removing the unwanted film around the pattern cleanly and leaving a clearly defined pattern planar to the substrate surface with no irregularities. The last statement is the definition of a "good liftoff".

There are three problems which can affect the achievement of a good liftoff:

1. Retention—The worst case problem for the liftoff process is when the unwanted film material will not separate from the pattern. Large areas of the substrate are left covered with material that will not lift off. Consequently, the pattern definition is extremely poor as shown in FIG. 1.

2. Ears—Deposited film material standing perpendicular to the substrate along the edge profile (sidewalls) of the pattern (FIG. 2). The ears can become a source of shorts in the circuit by protruding through subsequent layers. These ears get larger with increasing thickness of the deposited film.

3. Redeposition—Particles of material being rinsed away during the liftoff which become reattached to the substrate in random locations. Redeposition can occur in varying degrees of severity and its effect is to reduce the device yield.

Attempts have been made in the prior art to overcome these problems. For example, K. R. Grete (U.S. Pat. No. 3,849,136) describes the use of an aluminum layer and undercutting of the aluminum layer at the sidewall by overexposure to avoid edge tearing. Janos, et al. (U.S. Pat. No. 4,202,914) describe reactive ion etching an organic polymeric material under a silicon nitride layer to provide a discontinuity between a film on the substrate and the same film on the pattern layer. Homma, et al (IEEE Transactions on Electron Devices, Vol. Ed-28, No. 5, May 1981) describe the use of a molybdenum mask formed on polyimide to provide an undercut pattern for use when applying a metal layer to a substrate. The Gete, Janos et al, and Homma et al processes are bi-level photoresist type processes. A single-level photoresist process is described by M. Hatzakis, et al (IBM J. Res. Develop., Vol. 24, No. 4, July 1980) in which chlorobenzene is used to modify the top of the photoresist layer and thus provide and undercut the resist profile. H. Klose, et al (IEEE Transactions on Electron Devices, Vol. ed-32, No. 9, September, 1985) describe results obtained using a single-level negative photoresist process patented by Moritz and Paal (U.S. Pat. No. 4,104,070). In these prior art processes, the integrated circuit material is deposited directly upon the substrate in a single deposition step. However, the use of these prior art processes for submicron geometries has not been completely successful, and more reliable and economical processes are continually needed.

SUMMARY OF THE INVENTION

It is an object of the invention to provide a single-level photoresist liftoff process which minimizes defects produced during the processing of integrated circuits.

It is an object of the invention to provide a single-level photoresist liftoff process which can consistently produce integrated circuits with submicron pattern geometries.

According to the invention, a clean separation or gap is provided in the layer between the material deposited on the top surface of the photoresist and the material deposited on the substrate. Consequently, when the photoresist is lifted off the substrate, it carries with it the overlying material without tearing the layer or leaving behind material connected to the substrate. This is accomplished by providing a lip on the photoresist which overhangs the sidewalls of the photoresist and which defines the pattern. When a layer of material is deposited on the photoresist and on the uncovered portions of the substrate, the lip protects the sidewalls from deposition. It "shadows" the sidewall and provides a precise break in the layer between the material on top of the photoresist and the material on top of the substrate.

The lip is produced by depositing a thin layer of sealing material on top of the photoresist and on the surface of the substrate which was uncovered when the photoresist was developed. The sealing material must be compatible with the integrated circuit because it is not removed from the substrate and becomes a part of the circuit. For example, if the circuit being formed on the substrate is an interconnecting circuit of gold, then the thin sealing material can be gold or other metal which is compatible with the gold interconnecting circuit. If the pattern being formed is a dielectric pattern, then the sealing material can be a dielectric which is compatible with the dielectric pattern.

After depositing the thin layer of sealing material, the sidewalls of the photoresist are etched in order to undercut the sealing material and form a precise lip of sealing material which overhangs the sidewalls. Etching can be accomplished in a planar etcher or in a reactive ion etcher. A second layer of material is then deposited on top of the thin layer to provide the desired integrated circuit pattern of suitable thickness to meet design specifications.

Finally, the photoresist with its overlying thin layer and second layers of integrated circuit material is lifted off in the conventional manner. Lift-off is complete with no ears or redeposition resulting from sidewall deposition.

These and other features of the invention will be apparent from the following detailed description taken with reference to the accompanying drawings.

BRIEF DESCRIPTION OF THE DRAWINGS

FIGS. 4A to 4G are cross sections of a wafer during processing illustrating the steps in the process according to the invention;

DESCRIPTION OF THE PREFERRED EMBODIMENT

Figure 3:
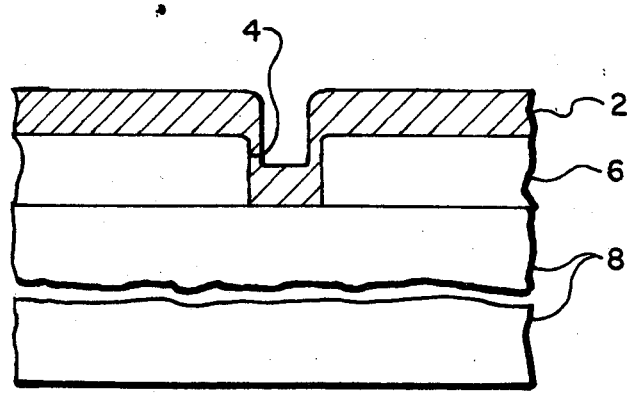
FIG. 3 is a cross section of a wafer during processing illustrating metal deposition on the sidewall of the photoresist.

The problems associated with the lift-off process arise because integrated circuit material 2 is deposited on the sidewall 4 of the photoresist profile as shown in FIG. 3. This problem is particularly severe when sidewall 4 of photoresist 6 is not completely perpendicular to the surface of substrate 8.

When film deposition begins, the deposited material 2 builds up on the surface of the wafer substrate 8, on the top surface of photoreesist 6, and also on sidewalls 4 of the photoresist profile. Films as thin as 500 angstroms result in a buildup of deposition material on the sidewall of the photoresist profile sufficient to make the lift-off process difficult. As the deposited film thickness increases, the amount of sidewall coverage on the photoresist profile increases also. Depending upon the type of film material (type of metal or dielectric) and upon the deposition method (evaporation or sputtering), the standard liftoff process becomes impossible to achieve with good results at film thicknesses greater than about 2,000 angstroms.

The film deposited on the substrate surface is connected to the film deposited on top of the photoresist. This connection along the sidewall of the photoresist profile causes the previously mentioned problems of retention, ears, and redeposition.

Figure 1:
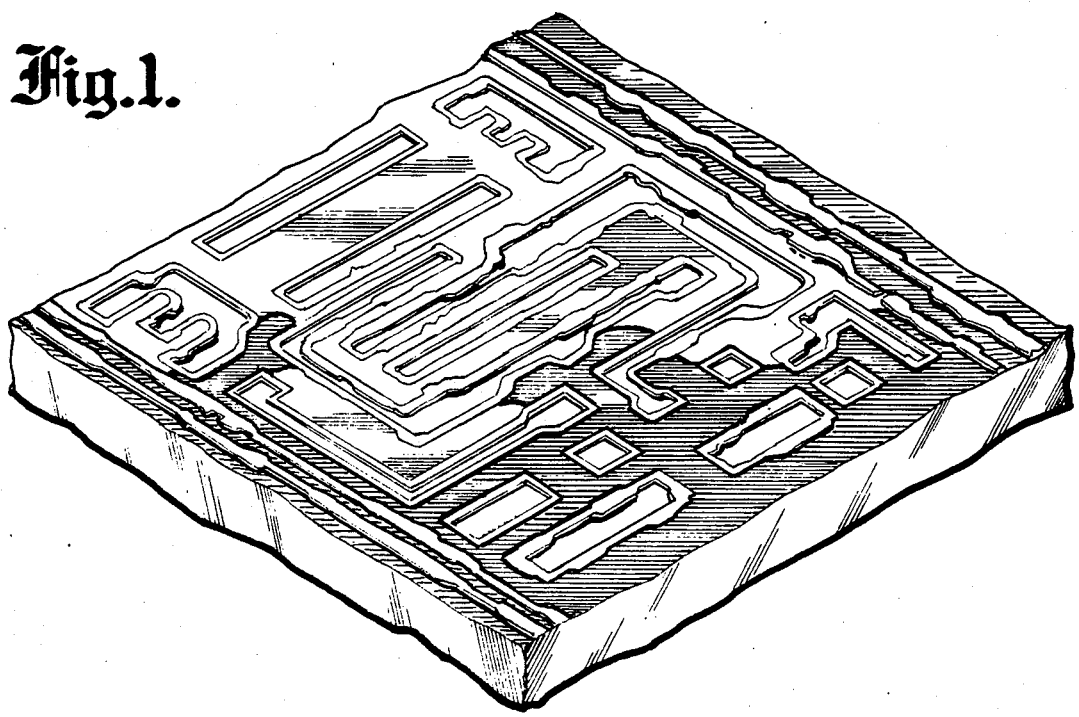
FIG. 1 is a top view of an integrated circuit after lift-off illustrating the problem of retention.

A poor liftoff with no separation between the unwanted material and the integrated circuit pattern (retention) occurs because the film deposited on the patterned area of the substrate becomes firmly attached to the material deposited on top of the photoresist. Thus, the top material will not separate and lift off (FIG. 1).

Figure 2:
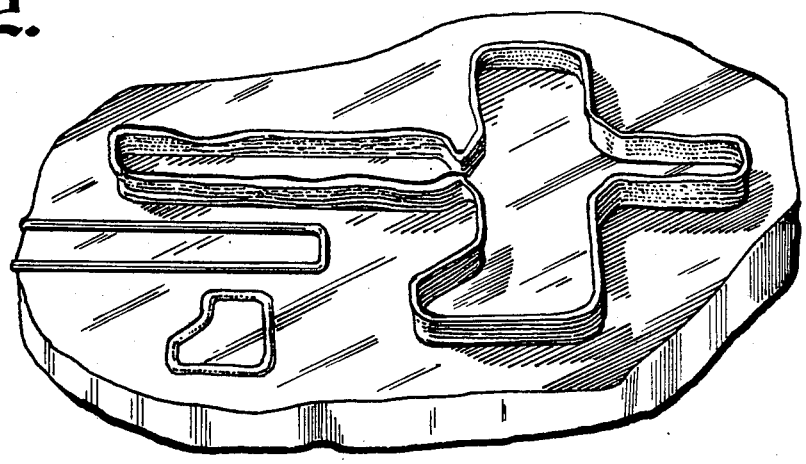
FIG. 2 is a perspective view of an integrated circuit after lift-off illustrating the problem of ears.

The problem of ears standing perpendicular to the integrated circuit pattern occurs when sidewall coverage builds up along the profile walls. Separation between the top and bottom portion of the layer occurs, but ears are left standing on the pattern as shown in FIG. 2.

The problem of redeposition during liftoff is caused by the sidewall coverage of the photoresist profile breaking away during liftoff and becoming attached to the substrate. These redeposited particles vary in size from submicron up to a few microns or larger.

According to the invention, these problems are avoided by providing a sidewall profile which is not covered by material during deposition. This is accomplished by providing a thin lip which extends over the sidewall and shields it. This lip is an extension of an initial deposit of a thin layer of sealing material which covers the photoresist and exposed areas of the substrate. The sealing material must be compatible with the integrated circuit because that portion of the thin layer which covers the substrate is incorporated into the circuit when the second deposit is made to form the integrated circuit. For example, if the integrated circuit to be formed on the substrate is a gold circuit, then the sealing material can be gold; or, for better adhesion, a TiAu or TiPt deposit. Examples of sealing material deposits which can be incorporated into a gold integrated circuit include: 100 Angstroms Au; 50 Angstroms Ti plus 50 Angstroms Au; 25 Angstroms Ti plus 75 Angstroms Pt; 75 Angstroms Ti plus 75 Angstroms Pt; 100 Angstroms Ti plus 100 Angstroms Au. Because both the sealing material and the metallization layer form the same circuit in the integrated circuit, the process is called a "dual deposition" process.

FIGS. 4A to 4G illustrate the steps used to construct the overhanging lip and to provide an integrated circuit which separates cleanly from the photoresist with its overlying layers. A positive or negative photoresist 6 is applied to substrate 8 and it is exposed and developed to define a pattern on the substrate as shown in FIGS. 4A, 4B, and 4C. The resist is baked out after developing as usual. Conventional photoresist processes using light, electron beam, X-ray lithography, or other imaging exposures can be used.

The film deposition to form the integrated circuit is done in two stages—a dual deposition process. The initial film deposition is done very lightly using physical vapor evaporation or sputtering. Layers with thicknesses in the range of 50 Angstroms to 200 Angstroms have been used. However, layers from 15 Angstroms to about 1000 Angstroms should be acceptable for some applications. As shown in FIG. 4D, this initial deposit 10 contacts the pattern geometry on the substrate surface, and contacts the top surface of photoresist 6 to seal it from etching. Because it is such a thin deposition, it does not build up substantially on the sidewall of the photoresist profiles. A 100 angstrom metal deposition on a 1.2 μm photoresist did not show a substantial buildup of film on the sidewall profile.

The substrate is then removed from the film deposition chamber and placed in an oxygen plasma system (planar etcher or reactive ion etcher). The oxygen plasma etches the photoresist at any region exposed to the gas. The etch rate is proportional to the time in the etch and the energy of the plasma. A 100 angstrom metal film was undercut 1000 angstroms by etching for 3.5 minutes in an oxygen plasma at a pressure of 60 μm and 200 watts of power. Due to the initial deposition sealing the top surface of the photoresist, the profile can be altered only along the sidewalls. Initial film deposit 10 on top of photoresist 6 remains intact, thus providing lip 12 which overhangs the sidewall of photoresist 6. Undercut profile 14 has been achieve that can produce accurate pattern definition and ideal lift-off conditions because overhanging lip 12 defines the pattern.

A second film deposition is done to meet the manufacturing specification for total thickness. Second deposition 16 falls on first deposition 10 over substrate 8 and over photoresist 6 without building up on the sidewall of the photoresist profile. The pattern definition remains excellent down to submicron dimensions. Total thickness of the film deposition is limited only by the vertical height of the photoresist. There is a gap between the sidewall of the photoresist 6 and the edge of the second deposition 16 which is equal to the original undercut (14 in FIG. 4E). This shows that the final linewidth of the deposition has not been affected by the undercut process.

Finally, the unwanted film material around the pattern is lifted off by dissolving the photoresist in a suitable solvent such as acetone. The solvent can be sprayed on the substrate, or a solvent bath agitated by ultrasonic can be used to aid the liftoff process. The end result is the unwanted material rinses away leaving only the patterned area intact on the wafer surface as shown in FIG. 4G.

Figure 5:
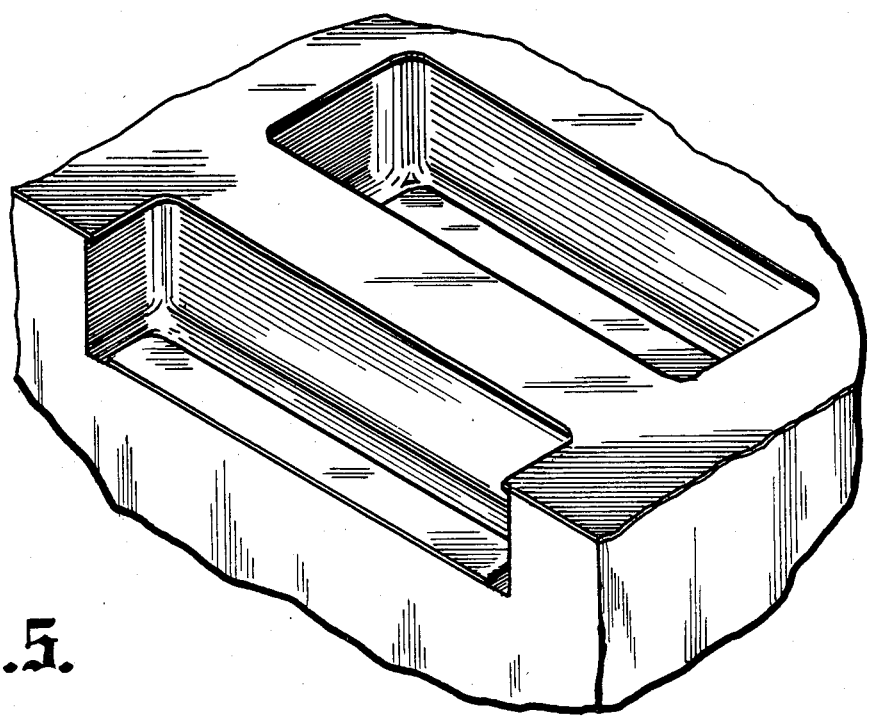
FIG. 5 is a perspective view of a cross section of a wafer showing the thin layer of sealing material after etching.

FIG. 5 is a draftsman's reproduction of a scanning electron microscope photograph (about 15,000 magnification) of a section of a wafer with 1.2 μm of photoresist. The top surface is a 100 angstrom thick film of TiAu (50 Angstroms Ti and 50 Angstroms Au) which has been undercut about 1000 angstroms by etching in an oxygen plasma for 3.5 minutes at 60 μm pressure and 200 watts power.

Figure 6:
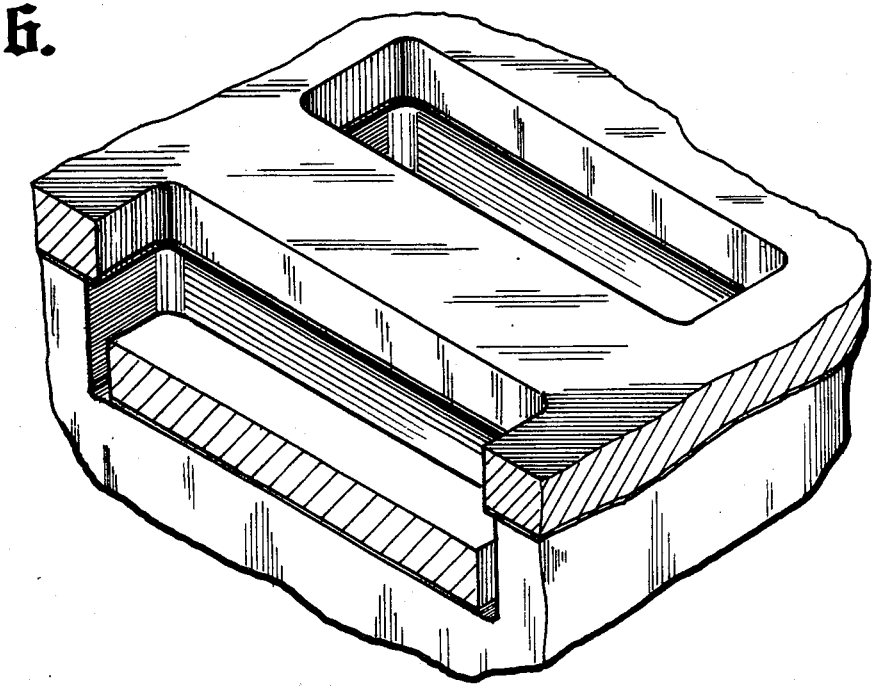
FIG. 6 is a perspective view of a cross section of a wafer showing the second layer of integrated circuit material on top of the thin layer of sealing material prior to liftoff.

FIG. 6 is a similar reproduction showing the substrate after a second deposition consisting of a 7,000 angstrom layer of gold on top of the initial deposition of 100 angstroms of TiAu.

Numerous variations can be made without departing from the invention. For example, initial metal depositions other than gold or TiAu can be used as a sealing material depending upon the requirements of the integrated circuit. If the integrated circuit which is being patterned is a dielectric component of the circuit (such as SiO), then a compatible dielectric material can be used as the sealing material for the initial deposition. The initial deposition does not have to be the same material as the second deposition provided that both materials are compatible in the final circuit. Photoresist etchants other than oxygen can be used to undercut the initial deposition. The process can be applied to various materials and levels in the circuit, and consequently the term "substrate" applies to the structure just below the level being deposited. Accordingly, it should be understood that the form of the invention described above is illustrative and is not intended to limit the scope of the invention.

What is claimed is:

1. A dual deposition liftoff process for forming a pattern of an integrated circuit on a substrate, comprising the steps of:

applying a photoresist to the substrate;

exposing the photoresist to an image of the pattern;

developing the photoresist to remove exposed portions of the photoresist and thereby form sidewalls which define the pattern on the substrate;

depositing a thin layer of sealing material on top of the remaining photoresist and on uncovered portions of the substrate, the sealing material being suitable for incorporation into the integrated circuit;

exposing the photoresist to an etchant whereby the sidewalls of the photoresist are etched and the thin layer of sealing material is undercut, thus forming a lip which overhangs the sidewall;

depositing a layer of integrated circuit material on top of the thin layer but not on the sidewalls which are protected from deposition by the overhanging lip; and lifting off the photoresist with its overlying thin layer and its layer of integrated circuit material.

2. The process as claimed in claim 1 wherein the integrated circuit material is a metal and the sealing material is a metal.

3. The process as claimed in claim 1, wherein the integrated circuit material is a dielectric and the sealing material is a dielectric.

4. The process as claimed in claim 1, wherein the substrate is selected from the group consisting of GaAs and silicon.

5. The process as claimed in claim 1, wherein the thin layer has a thickness within the range of about 15 angstroms to 1000 angstroms.

6. The process as claimed in claim 1, wherein the thin layer is deposited by physical vapor deposition.

7. The process as claimed in claim 1, wherein the thin layer is deposited by sputtering.

8. The process as claimed in claim 1, wherein the step of exposing the photoresist to an etchant comprises exposing the photoresist to an oxygen plasma.

9. The process as claimed in claim 8, wherein the step of exposing the photoresist to an oxygen plasma is accomplished in a planar etcher.

10. The process as claimed in claim 8, wherein the step of exposing the photoresist to an oxygen plasma is accomplished in a reactive ion etcher.

11. The process as claimed in claim 1, wherein the image is a light image.

12. The process as claimed in claim 1, wherein the image is an electron beam image.

13. The process as claimed in claim 1, wherein the image is an x-ray lithography image.

* * * * *